(12) United States Patent
Deibele et al.

(10) Patent No.: US 8,063,649 B2
(45) Date of Patent: Nov. 22, 2011

(54) BROADBAND HIGH IMPEDANCE PICKOFF CIRCUIT

(75) Inventors: Craig E. Deibele, Knoxville, TN (US); George Brian Link, Knoxville, TN (US); Vladimir V. Peplov, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 469 days.

(21) Appl. No.: 12/384,358

(22) Filed: Apr. 3, 2009

(65) Prior Publication Data

US 2010/0253366 A1    Oct. 7, 2010

(51) Int. Cl.
*G01R 27/28* (2006.01)
*H04B 3/28* (2006.01)

(52) U.S. Cl. ........ 324/627; 324/602; 324/605; 324/609; 324/72; 324/72.5; 333/12; 333/245

(58) Field of Classification Search .................. 324/602, 324/605, 609, 627, 72, 72.5; 333/12, 172, 333/100, 124, 125, 81 A
See application file for complete search history.

(56) References Cited

U.S. PATENT DOCUMENTS

| | | | |
|---|---|---|---|
| 4,051,432 A * | 9/1977 | Sarjeant | 324/72.5 |
| 4,341,990 A * | 7/1982 | Davis | 323/303 |
| 4,458,196 A * | 7/1984 | Goyal et al. | 324/649 |
| 4,845,691 A * | 7/1989 | Itaya et al. | 368/120 |
| 5,107,201 A * | 4/1992 | Ogle | 324/72.5 |
| 5,121,090 A * | 6/1992 | Garuts et al. | 333/124 |
| 5,237,295 A * | 8/1993 | Reddick et al. | 333/131 |
| 5,408,236 A * | 4/1995 | Freiheit-Jensen et al. | 324/72.5 |
| 5,612,653 A * | 3/1997 | Dodds et al. | 333/124 |
| 6,307,363 B1 * | 10/2001 | Anderson | 324/72.5 |
| D475,350 S * | 6/2003 | Soulodre | D13/151 |
| 6,626,352 B2 * | 9/2003 | Li | 228/245 |
| 2006/0038631 A1 * | 2/2006 | Yetter et al. | 333/24 C |

FOREIGN PATENT DOCUMENTS

WO      WO 0076159 A1  *  12/2000

* cited by examiner

*Primary Examiner* — Huy Q Phan
*Assistant Examiner* — Lamarr Brown
(74) *Attorney, Agent, or Firm* — Brinks Hofer Gilson & Lione

(57) ABSTRACT

A measuring system minimizes the parasitic affects of lumped circuit elements. The system includes two or more in-situ interfaces configured to conductively link a source to an internal load and an external load. The in-situ interfaces are linked to a shunt conductor. Two or more linear and dynamic elements conductively link the in-situ interfaces in series. The dynamic elements are configured to overwhelm the parasitic self-capacitance of an input circuit coupled to at least one of the in-situ interfaces. A shield enclosing at least one of the linear and dynamic elements has a conductive surface to fields and electromagnetic interference. The shield has attenuation ratios that substantially dampen the parasitic capacitance between the linear and dynamic elements that bridge some of the in-situ interfaces.

22 Claims, 12 Drawing Sheets

BROADBAND HIGH IMPEDANCE PICKOFF CIRCUIT

BACKGROUND OF THE INVENTION

1. Technical Field

This application relates to a closed circuit, and more particularly to a broad band multi-terminal network that mitigates parasitic elements.

2. Related Art

Electromagnetic signals within a wideband may be distorted by reactive elements. The inductance and capacitance within a circuit may distort the frequency and phase response of high frequency inputs or communication signals. Parasitic elements may affect inputs and outputs by reducing bandwidth or by creating unwanted oscillations and ringing.

Unwanted inductance and capacitance may occur through links that connect electronic components or by their proximity to each other. Measurement systems that display voltage across or current passing through these components may add interference. Such circuits may require open access to measure inputs or outputs and distort waveforms or signals through their parasitic capacitance and low direct current resistance.

SUMMARY

A measuring system minimizes the parasitic effects of lumped circuit elements. The system includes two or more in-situ interfaces configured to conductively link a source to an internal load and an external load. The in-situ interfaces are linked to a shunt conductor. Two or more linear and dynamic elements conductively link the in-situ interfaces in series. The dynamic elements are configured to overwhelm the parasitic self-capacitance of an input circuit coupled to at least one of the plurality of in-situ interfaces. A shield enclosing at least one of the linear and dynamic elements has a conductive surface to fields and electromagnetic interference. The shield has attenuation ratios that substantially dampen the parasitic capacitance between the linear and dynamic elements that bridge some of the in-situ interfaces.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

In-situ measuring or pickoff devices may interface open or closed networks (or circuits). The systems measure output with little magnitude or phase distortion with respect to frequency. Some devices have large dynamic ranges (e.g., single volts, kilo-volts, mega-volts, etc.) that interface one or more circuits. Some measuring devices do not require separate power sources and are not susceptible to electro-static discharge damage or over-voltage conditions. Due to shielded enclosures, high density layouts, and/or high output ranges, there may be little need for large amounts of insulation or warnings against shock when operating these systems. The pickoff devices may provide low parasitic capacitance (e.g., $C_p \cong 0$) and high linear input impedances. The devices may achieve improved high frequency responses and lower loading than alternative passive and/or active measuring devices.

Figure 1:
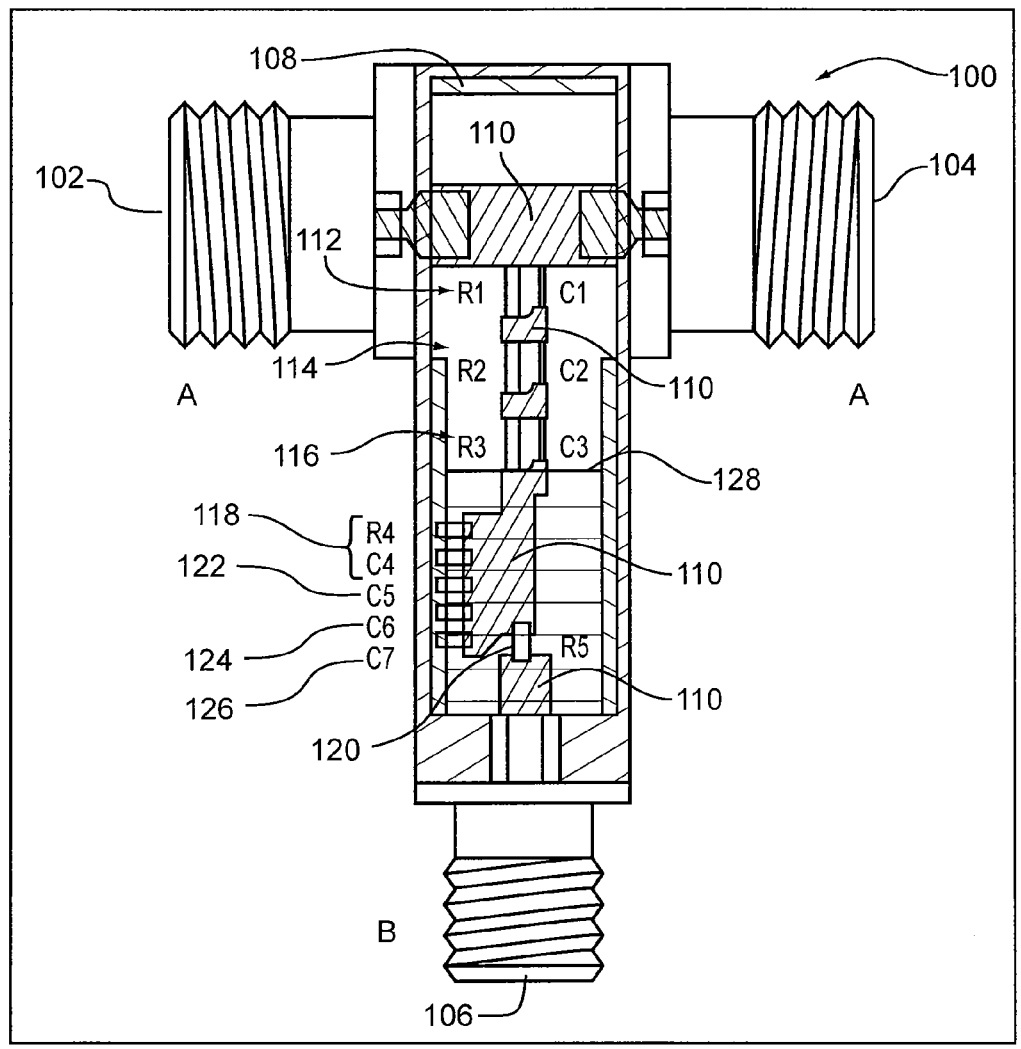
FIG. 1 is an exemplary pickoff circuit.

The in-situ measuring or pickoff device may include two or more interfaces. In FIG. 1 the device includes an input 102, an output 104, and a measuring tap 106. The helical or spiral ridges that may be a unitary or integrated part of an insulating enclosure 100 may join or fasten a conductor or an input circuit (or an enclosure containing such elements) to an output conductor or load (not shown) and to a measuring tap 106. A ground 108 lying within a multi-sided plane (e.g., shown as a four sided plane in cross-section) may provide a conducting path to a ground potential or a conducting body serving as a ground potential (e.g., such as a safety device). Conductivity paths 110 may facilitate power or signal flow between the input 102, output 104, and measuring tap 106. A shield 128 insulates a portion of the pickoff device. The shield 128 may reduce electromagnetic interference by redirecting field lines to its conductive structure (or outer surface) that may have high attenuation characteristics. In some systems one or more foil or sheets may absorb and attenuate fields by terminating the fields at a lower potential such as ground. Combinations of shielding (e.g., foils, sheets, screens, etc.) that may (or may not) comprise two, three, or more materials or alloys protect a portion of the pickoff circuit from electromagnetic interference. In these systems, combinations of materials may be used when high magnetic saturations are approached (or are expected).

Parallel combinations of linear and dynamic elements 112-116 are conductively linked through conductivity paths 110. Two, three (shown as 112-116 in FIGS. 1 and 2), or more linear and reactive components may link the input 102 to the measuring tap 106. By their proximity to one another, a parasitic capacitance may provide a low impedance path between input 102 and a node connected to a terminating linear element 120 (shown as a resistor) 120. The voltage between the parasitic capacitance 202 (shown in FIG. 2) and ground may shunt the voltage across a linear and dynamic element 118. That voltage may be a fraction of the total input voltage that reactance 118 is of the total reactance (e.g., linear and dynamic elements 112-116 and may include the optional reactive elements (capacitors) 122-126). Optional reactive elements (e.g., capacitors) 122-126 may comprise mechanical, electronic, or tunable elements such as varactors (e.g., semiconductor in which the capacitance is sensitive to an applied voltage or current like tunable element) that may be manually or automatically adjusted to the linear and dynamic elements 112-116 or in some alternate systems to the input frequency or complex impedance received/measured at the input 102. In some systems, the optional reactive elements may be tuned through a comparison of outputs across an attenuator load and the pickoff device in response to a pulsed source with a fast or substantially fast rise time.

Figure 2:
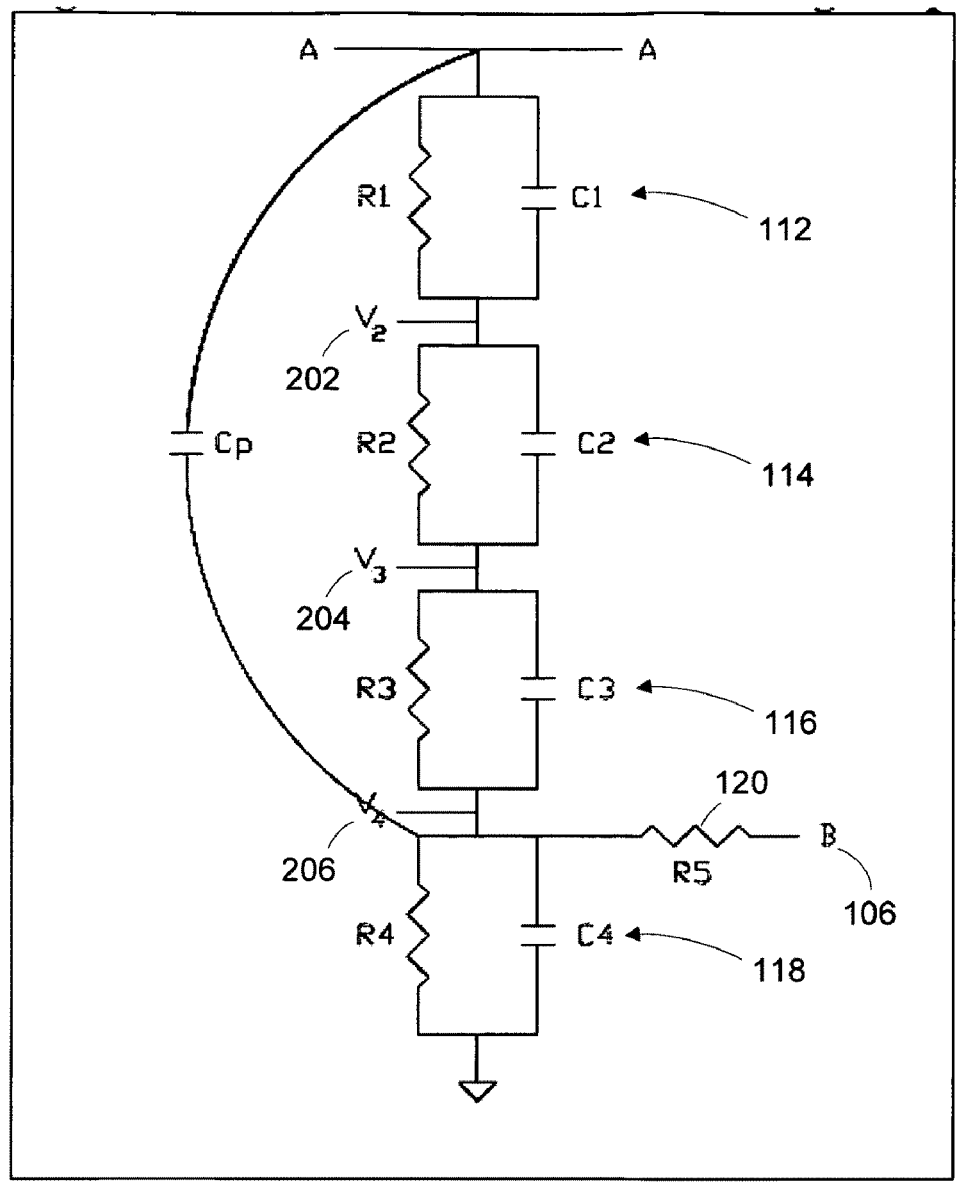
FIG. 2 is an exemplary schematic of FIG. 1.
Figure 12:
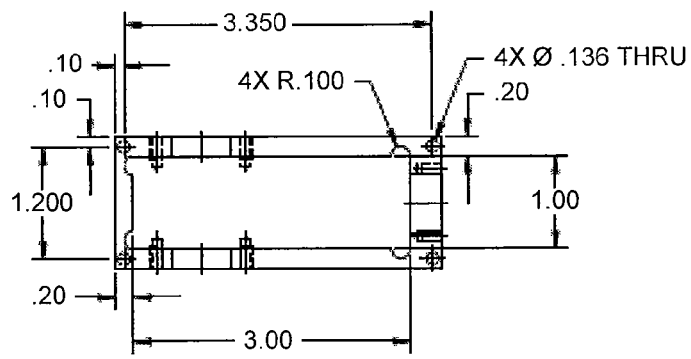
FIG. 12 shows an exemplary enclosure for a pickoff circuit.
Figure 12:
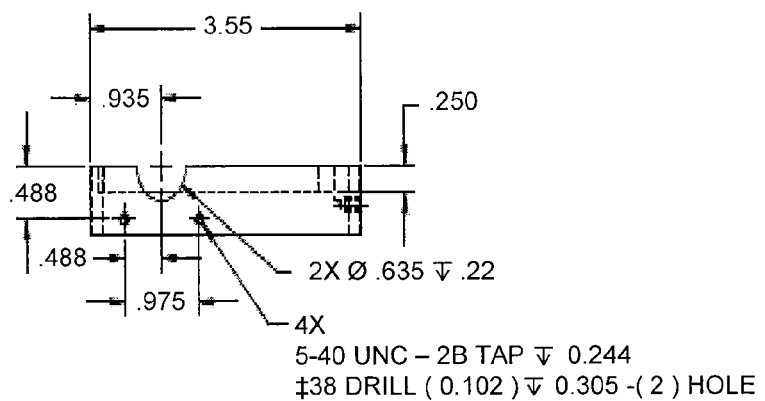
Figure 12:
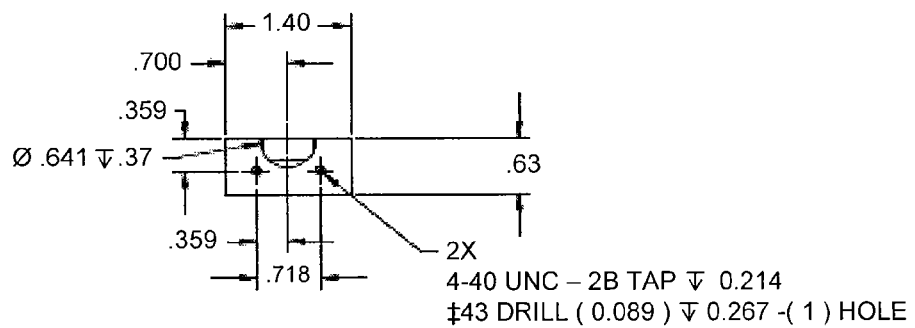
Figure 12:
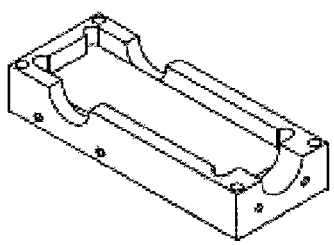

FIG. 2 is a schematic of an exemplary pickoff circuit that may be received by the exemplary insulating enclosures 100 of FIGS. 1 and 12. Parallel combinations of resistors and capacitors 112-118 may render a high impendence through predetermined element values and rated input frequency ranges. The complex quantities may be selected so that the output of the measuring tap 106 is finger-safe (e.g., reduces shock hazards, arcing, undesired events or accidents). Parasitic capacitance $C_p$ may be minimized or substantially eliminated through the shielding of terminating linear element 120, linear and dynamic element 118, and optional reactive elements (e.g., capacitors) 122-126.

Voltage division may express the voltage across linear and dynamic element 118.

$$V_4 = V_3 \frac{R_4 \| C_4}{R_4 \| C_4 + R_3 \| C_3} =$$

$$V_3 \frac{\frac{R_4}{1+i\omega R_4 C_4}}{\frac{R_4}{1+i\omega R_4 C_4} + \frac{R_3}{1+i\omega R_3 C_3}} = \frac{R_4(1+i\omega R_4 C_4)}{R_4(1+i\omega R_3 C_3) + R_3(1+i\omega R_4 C_4)}$$

When linear and dynamic element 116 is substantially equal to linear and dynamic element 118, the voltage at $V_4$ may be a fraction of the total voltage of $V_3$.

$$R_4 C_4 = R_3 C_3 \Leftrightarrow V_4 = V_3 \frac{R_4}{R_4 + R_3}$$

When the linear and dynamic elements 112-118 are substantially matched (e.g., R4,C4≅R3,C3≅R2,C2≅R1,C1 the voltage at $V_4$ may be a fraction of the total input voltage of $V_a$.

$$V_4 = V_a \frac{R_4}{R_4 + R_3 + R_2 + R_1}$$

To ensure element matching or a finger-safe output, some exemplary systems may cascade large highly rated precision resistors (e.g., about 50 kΩ). To minimize some parasitic effects, the systems may precisely match the resistors and may couple other reactive elements (e.g., capacitive elements) to overwhelm the parasitic self-capacitance of some input circuits, measuring devices, or sources. In systems that are not well matched, or do not include additional reactive elements, or are not shielded (as described), the parasitic capacitance of each linear component may be estimated to be about 0.5 pF. At this level, the time constant of the parallel combinations of resistors and capacitors may be about 25 nano-seconds or have a cutoff frequency of about 40 MHz. When components are not well matched or do not include the exemplary shielding, small matching errors may affect the output bandwidth greatly.

Figure 3:
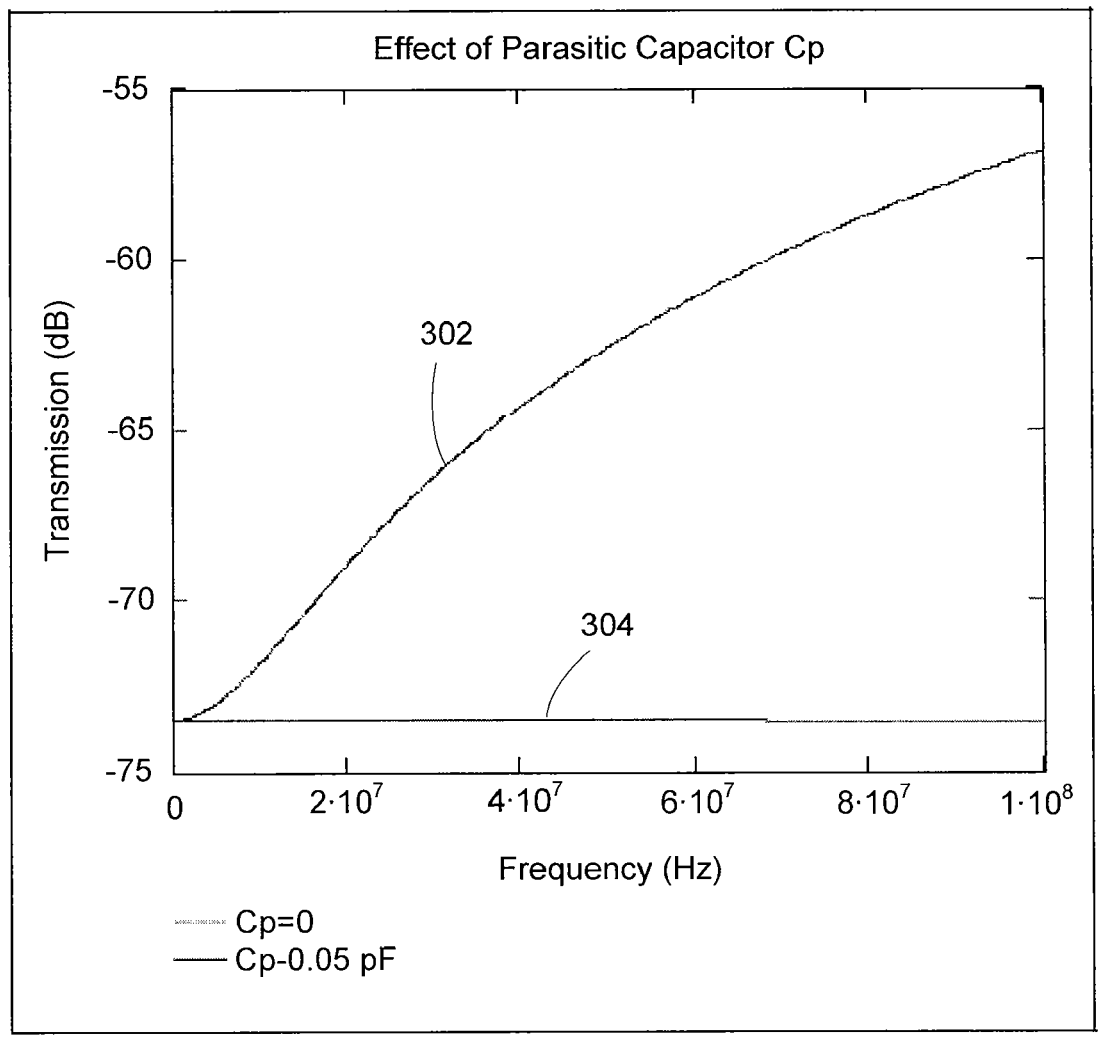
FIG. 3 is a magnitude comparison of outputs with and without parasitic capacitance.
Figure 4:
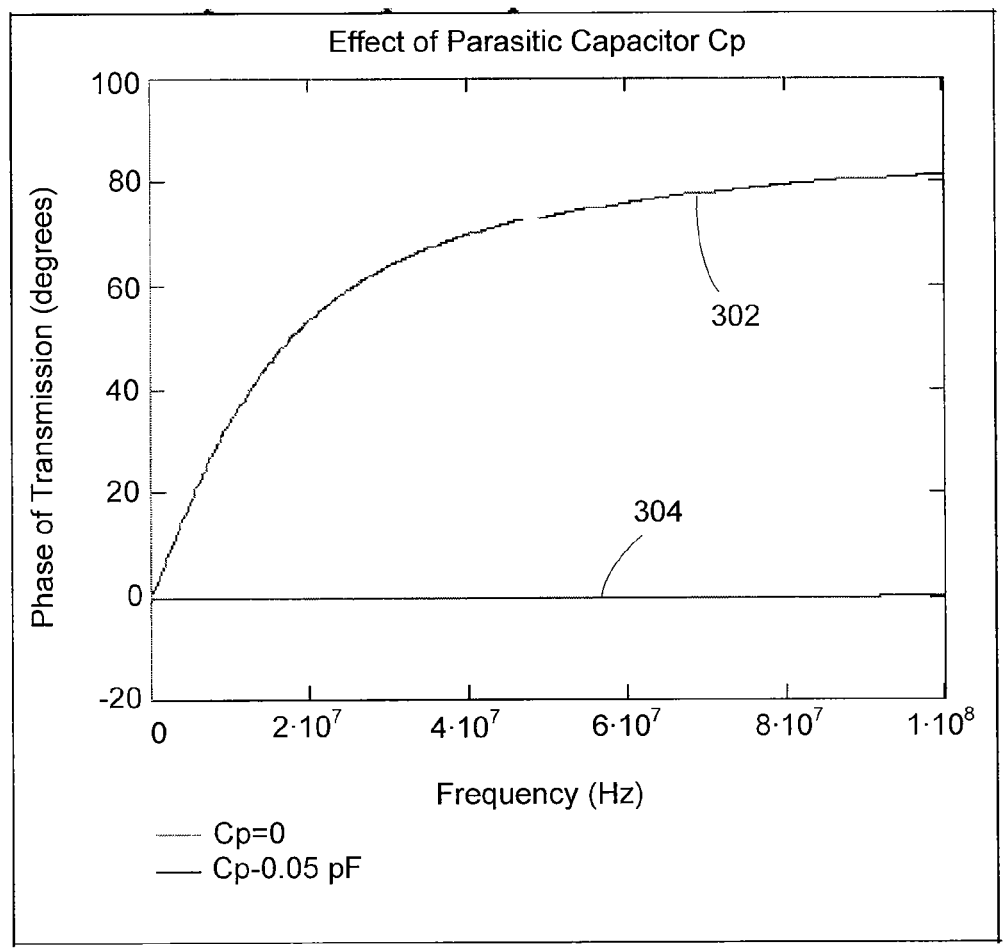
FIG. 4 is a phase comparison of outputs with and without parasitic capacitance.

FIG. 3 is a magnitude comparison (in dB) of outputs from input 102 to measuring tap 106 with parasitic capacitance (shown as graph 302) and without parasitic capacitance (shown as graph 304). FIG. 3 shows how the magnitude of an output may distort the output from $H_n$ to $H_0$. Phase is also affected. FIG. 4 is a phase comparison of outputs with parasitic capacitance (graph 402) and without parasitic capacitance (graph 404).

Figure 5:
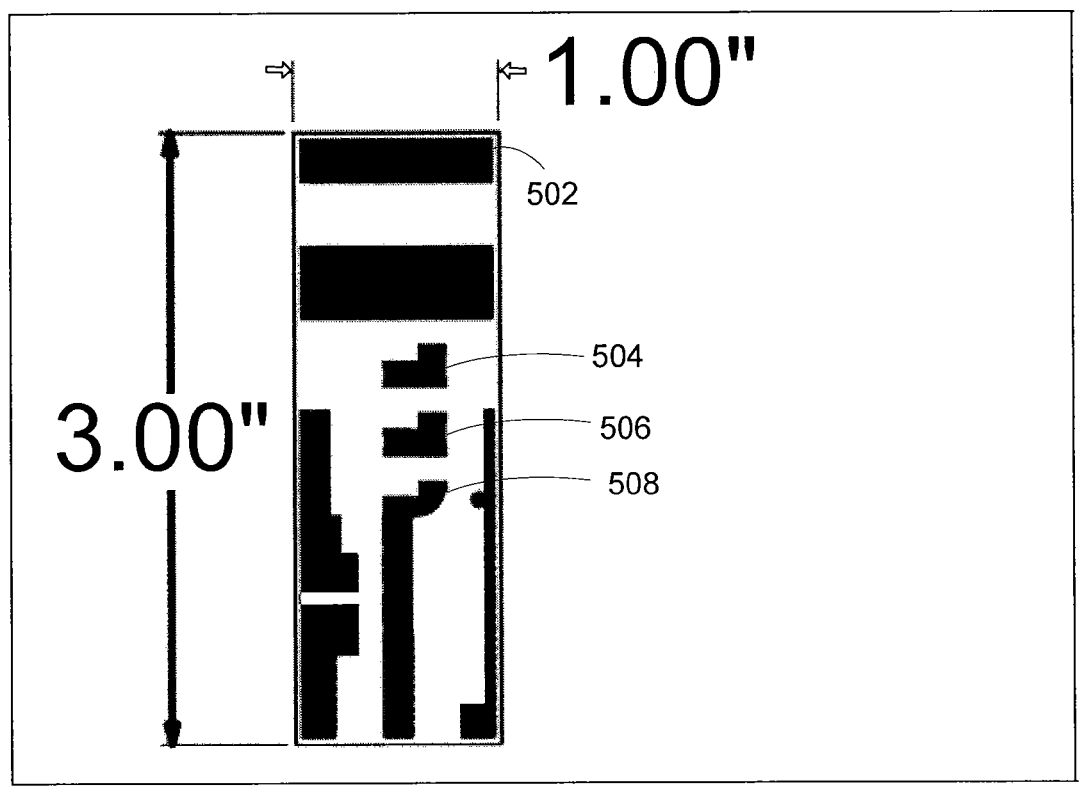
FIG. 5 is an exemplary board layout of an exemplary pickoff circuit.

FIG. 5 is an exemplary board layout of an exemplary pickoff circuit. In FIG. 5, the exemplary circuit board may comprise two (or more) single layer or multilayered about 0.125" circuit boards. A distal board (or layer) may comprise or include a ground 502. A proximal board may provide electrical connections between components and connections to other layers. In some layouts a main power trace may have impedance matched to about 50 Ohms. Some linear elements (or resistors R1, R2, and R3) may be rated at about 50 k Ohm, about 3 kV, about 1%, and about 1 W by Ohmite and may couple the L shaped traces 504-508 shown in FIG. 5. Dynamic elements (or C1, C2, and C3) may be positioned adjacent to R1-R3, respectively and may be rated at about 12 pF, about 3.15 KV, and about 5% by Murata. A 7/16 connectors or input 102 may comprise a 7/16 female; 4 hole panel mount; solder cup contact by Pasternack. The measuring tap 106 may comprise an 82-97 square flange female N-connector by Amphenol. Other linear elements may be rated at (R4) about 2 k Ohm, (R5) may comprise about a 475 Ohm resistor. Other dynamic elements (or C5-C7) may be rated at about 25V.

To minimize or substantially eliminate undesired interference, selected combinations of linear and dynamic elements may be enclosed by the shield 128. While this initial attenuation ratio of the shield 128 may be substantially uniform, in alternate pickoff circuits the attenuation ratio of the shield 128 varies. In some systems shield variance may be based on position to or characteristics of a source (e.g., input 102 amplitudes or input frequencies) or an output (amplitudes and/or frequencies occurring at the measuring tap 106 or load 104) or may be based on other characteristics. The thickness, width, and/or shape of the shielding structure may be uniform, vary with the topography of the shielded pickoff elements that comprise the device, or vary with the insulating enclosure 100 (or may comprise enclosure 100). In some systems, linear and dynamic elements R4, C4, R5, C5, C6, C7, and measuring tap 106 are substantially or fully enclosed within the shield 128.

In the exemplary board layout of FIG. 5 the traces between R3/C3 and R4 and the trace between R5 and measuring tap 106 may be discontinuous. A ground plane may be positioned on top of one or more micro-strips. Layers of a polyimide film that may remain stable across a wide temperature range (e.g., −273° C. to +400° C. such as Kapton manufactured by Dupont®) may be positioned above the ground plane. Traces positioned on the polyimide film may comprise the conducting or communication links between the elements. A second polyimide layer may be positioned above R4, R5, and C5-C7 and their respective connections. In some pickoff devices, an ancillary shield of uniform or varying attenuation ratios may be positioned above (or within alternative pickoff devices below/above and below) the polyimide films.

Figure 6:
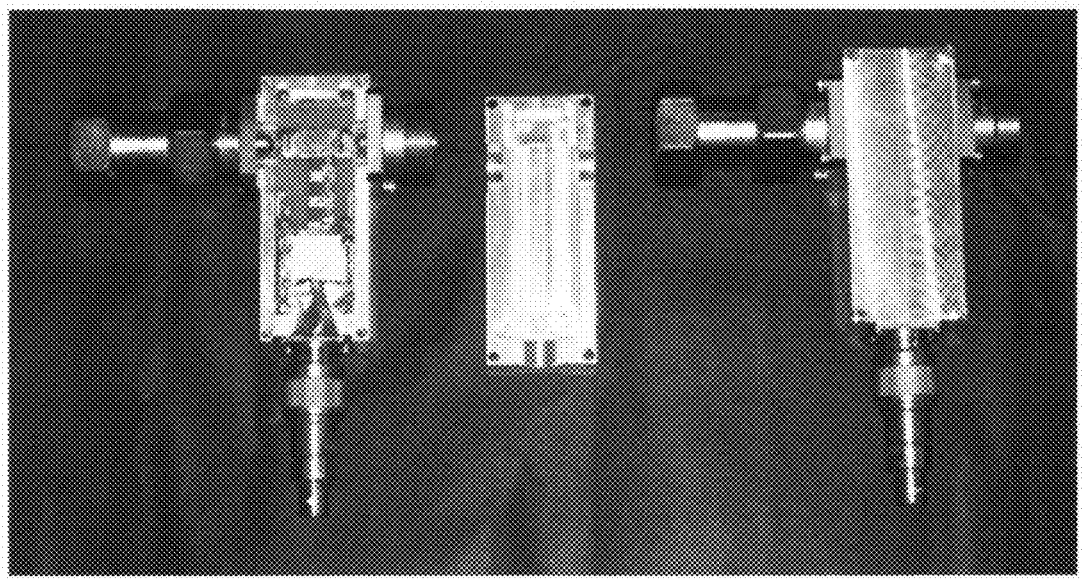
FIG. 6 is an exemplary image of an assembled and unassembled exemplary pickoff circuit.
Figure 7:
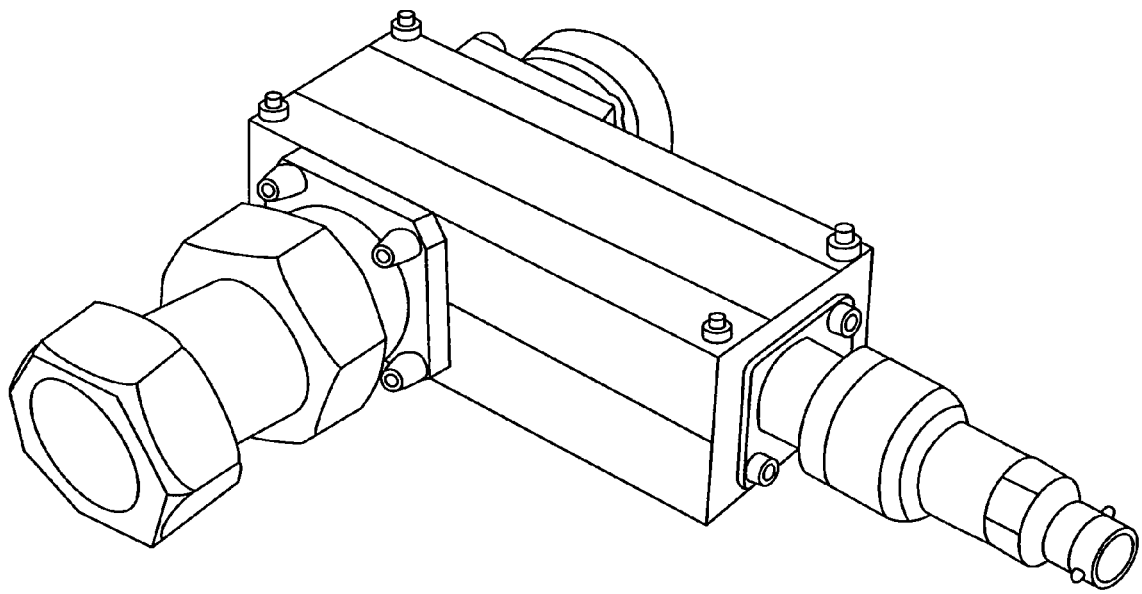
FIG. 7 is a profile of an assembled pickoff circuit.

FIGS. 6 and 7 show partially assembled and assembled exemplary pickoff devices. The pickoff devices are configured to be placed or integrated in circuit (or load) to collect data or signals at the actual location of the circuit (as opposed to a remote sensing device or ancillary probes). The devices do not require open access (e.g., open circuits or unrestricted component or measuring point access) to monitor and measure signals that some measuring devices require. The pickoff device allows the measurement of current and voltage values too large to be directly measured by other devices. A shunt conductor is placed in series between the source and external load to ensure nearly all of the current or voltage to be measured will flow through the conductor without disturbing or significantly affecting the signal flowing from the input 102 to the output 104. The linear and dynamic elements 112-116 may draw safe signal levels with minimal signal or power losses. In some alternate pickoff devices, safety devices may protect ancillary circuits coupled to the measuring tap 106 or output 104 from excessive current or voltages. The alternate pickoff devices may include elements that melt or open when current passing to the measuring tap 106 exceeds a predetermined level. Other alternate systems include elements that prevent current or voltage surges and/or reduce or substantially eliminate short-lived unpredictable increases in power from reaching the measuring tap 106.

Figure 8:
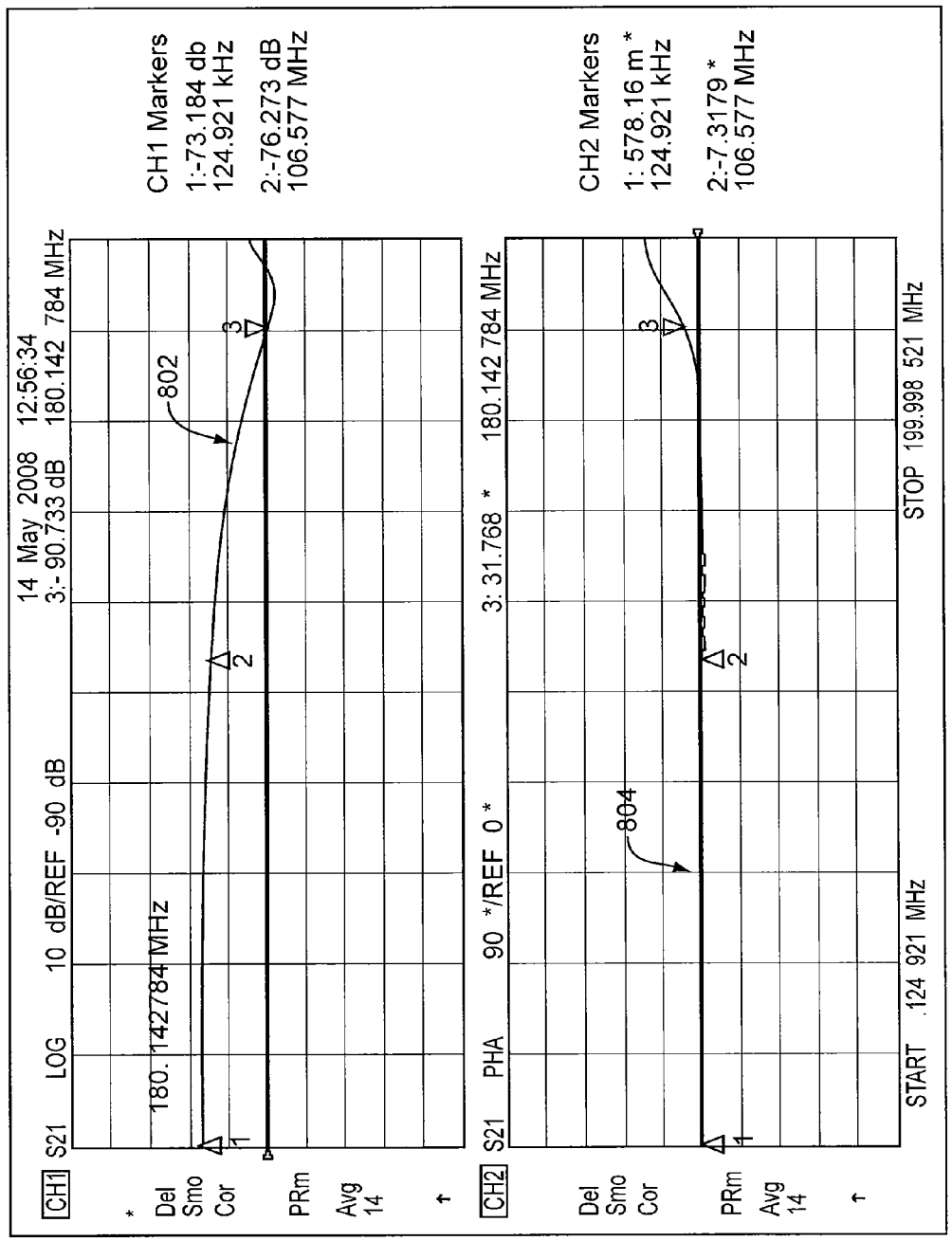
FIG. 8 is an exemplary output of magnitude and phase of the exemplary circuit of FIG. 1.

FIG. 8 is an exemplary output of magnitude and phase of the exemplary circuit of FIG. 1 through a vector network analyzer. The magnitude shown in the upper graph as 802 has a low pass characteristic that starts at about 125 kHz (1), passes through about 106 MHz (2) before stopping at about 180 MHz (3). In the upper graph the 3 dB relative difference in power occurs at about 106 MHz. When bandwidth (BW) is defined by the algorithm following this paragraph, the bandwidth of the exemplary circuit is about 160 MHz. The lower graph shows a substantially flat phase 804 with small or negligible dispersion out to about 180 MHz. In comparison to a circuit without the described shielding, the phase was flat to about 20 MHz.

$$BW = 2 \frac{\text{Max}\left(\int_0^\infty \text{Re}(S_{21}(\omega))e^{i\omega t_d})d\omega\right)}{\text{Max}(S_{21}(\omega))}$$

Figure 9:
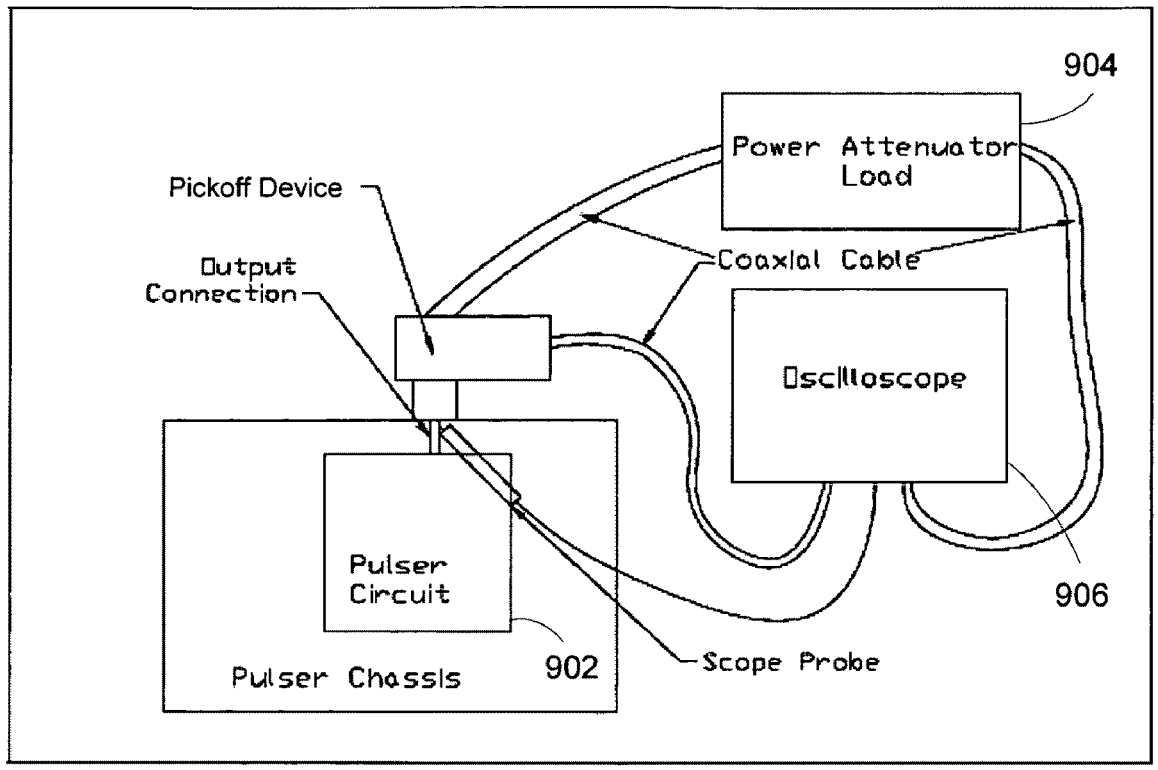
FIG. 9 is a test setup of an oscilloscope and an exemplary pickoff device.
Figure 10:
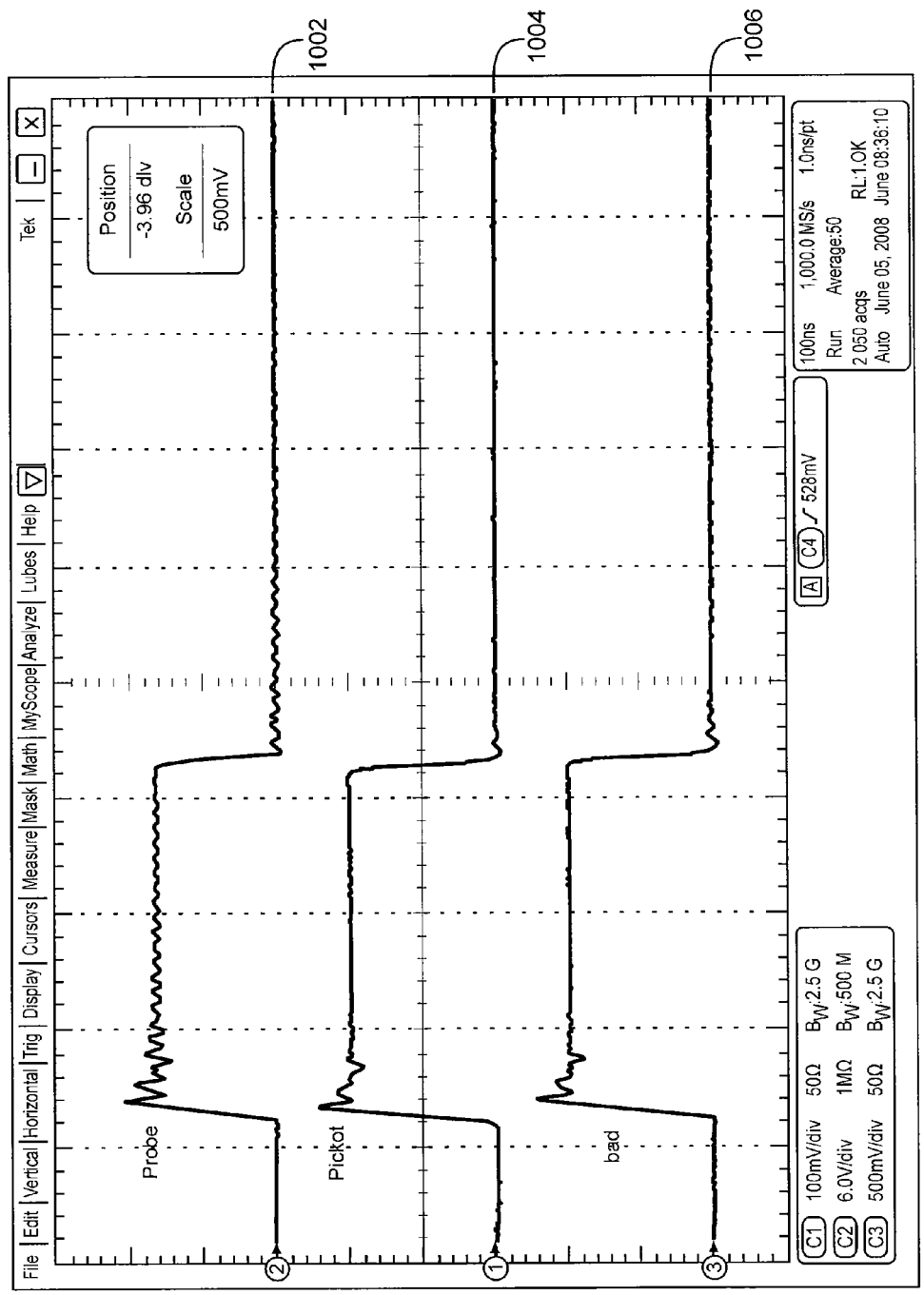
FIG. 10 shows exemplary output, an oscilloscope output, and the output measured through an exemplary pickoff device.

A second measuring device of an exemplary pickoff device includes a pulse circuit (e.g., a Time Domain Reflectometer or TDR), a test load 904, and an oscilloscope 906 shown in FIG. 9. The output (shown in FIG. 10) traces the output of the scope probes 1002, an exemplary pickoff device 1004, and the attenuator load 1006 on a screen rendered by a display. A comparison of the output shows the ripple and noise content that may be associated with charge and discharge events of the input and output capacitance. The ringing or ripple may be highly dependent on the circuit topology, circuit parasitics, and circuit board layout. As shown by the output 1002, the oscillations or noise spikes may be highly dependant on the capacitance of the probes and/or circuit layout. In some systems the large ground loop formed by the probes may magnify the interference. In these systems even a short ground wire length may result in significant noise spikes. Like the output measured at the attenuator load 1006, the output of the exemplary pickoff device 1004 shows little noise pickup.

Figure 11:
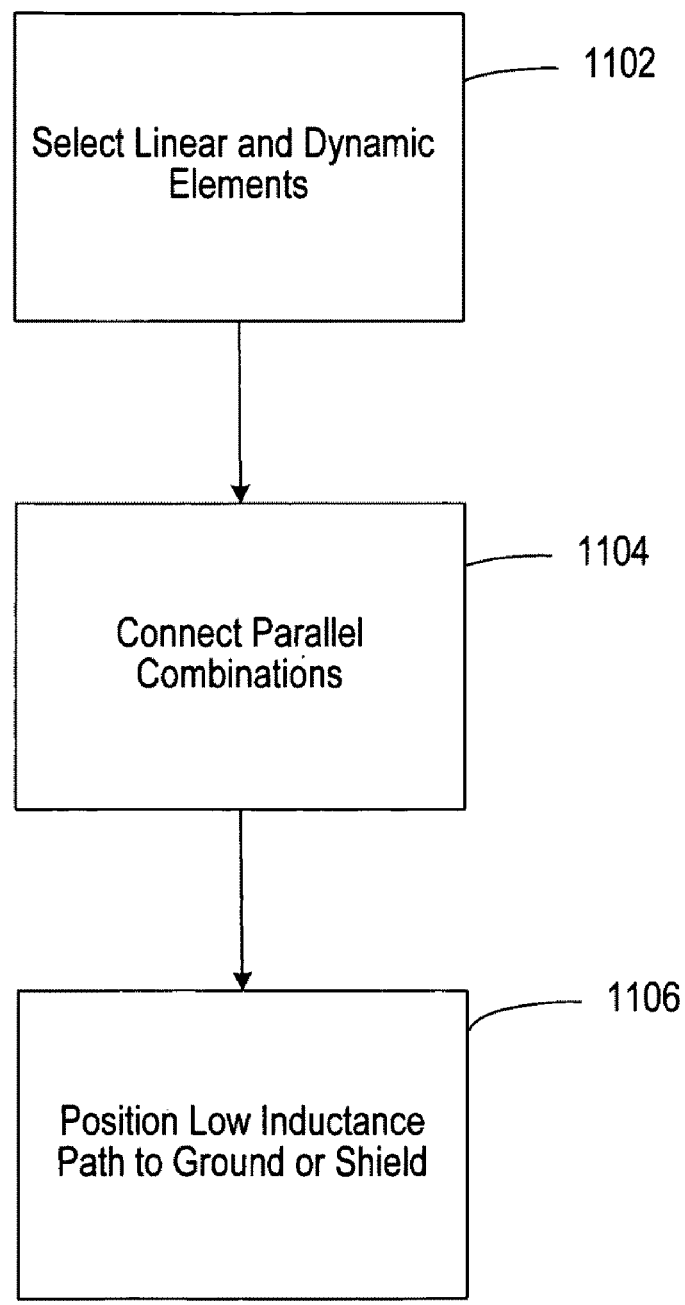
FIG. 11 is an exemplary process of assembling a pickoff circuit.

FIG. 11 is a method of assembling an exemplary pickoff circuit that may monitor an output with little or no noise pick up. Initially, linear and dynamic elements are selected at 1102. In some assemblies resistors and capacitors are selected within a tolerance level (e.g., capacitors may be selected within about a 0.5% tolerance). At 1104, parallel combinations of linear and dynamic elements are connected in series. The parallel combinations of linear and dynamic elements are conductively linked through conductivity paths to prevent current, voltage or power levels from reaching a designated output. At 1106 a low inductance path to ground or shield is positioned or wrapped around the entire or selected circuit elements (e.g., 118, 120-136). The shield reduces electromagnetic interference by redirecting field lines to its conductive structure (or outer surface) that may have high attenuation characteristics. In some methods one or more foil or sheets may enclose selected circuit elements to absorb and attenuate fields by terminating the fields at a lower potential such as ground. Combinations of shielding (e.g., foils, sheets, screens, etc.) that may (or may not) comprise two, three, or more materials or alloys protect a portion of the pickoff circuit from electromagnetic interference. The circuit layout and shielding may be coupled to or linked to an insulating or conducting housing like the enclosure 100 shown in FIG. 12. Using a pulse source, such as a TDR, the output of the exemplary assembly may be automatically or mechanically tuned to an input source/circuit and/or output source/circuit. In some assemblies the devices are tuned by applying secondary source (e.g., a voltage or current apart from an input source to a tunable reactance) or by mechanically inserting a selected reactance.

The methods and systems described above may interface or be integrated within high power circuits and devices such as a Medium Energy Beam Transport (MEBT) like a MEBT power pulser. The MEBT may have a normal pulse at about 2.5 kV (or above, e.g., 100 kV/or below) at a 7% (or greater/lesser) duty cycle into about a matched 50 Ohm load. Some exemplary pickoff circuits have a demonstrated bandwidth of about 160 MHz and a low phase dispersion that extends to about 180 MHz. Some microstrip pickoff circuits may covey micro-wave-frequency signals that are shielded from unintentional radiation. The pickoff circuits are finger safe, mitigate the parasitic behavior of elements, and are not dependant on or substantially affected by the length of cable with which it is desired to monitor the signal levels.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A measuring system that minimizes the parasitic affects of lumped circuit elements comprising:
    a plurality of in-situ interfaces configured to conductively link a source to an internal load and an external load, the in-situ interfaces coupled to a shunt conductor;
    a plurality of linear and dynamic elements conductively linked to the plurality of in-situ interfaces in series; the dynamic elements configured to overwhelm the parasitic self-capacitance of an input circuit coupled to at least one of the plurality of in-situ interfaces; and
    a conductive shield enclosing at least one of the plurality of linear and dynamic elements comprising a conductive surface to fields and electromagnetic interference and having attenuation ratios configured to substantially dampen the parasitic capacitance between the linear and dynamic elements that bridge at least two of the plurality of in-situ interfaces.

2. The measuring system of claim 1 where each of the in-situ interfaces is coupled to an enclosure having a plurality of substantially helical surfaces.

3. The measuring system of claim 1 where the plurality of linear and dynamic elements comprises resistive and reactive elements coupled in parallel.

4. The measuring system of claim 3 where a plurality of resistive and reactive elements are coupled in parallel between a selected plurality of the in-situ interfaces.

5. The measuring system of claim 3 further comprising a semiconductor or reactive elements having a capacitance that is mechanically or electrically tuned to the plurality of linear and dynamic elements.

6. The measuring system of claim 5 where the shield comprises one or more alloys.

7. The measuring system of claim 3 further comprising a semiconductor element having a capacitance that is automatically tuned to the plurality of linear and dynamic elements through an applied voltage not passing through the plurality of in-situ interfaces.

8. The measuring system of claim 5 where the shield comprises one or more alloys having varying attenuation ratios.

9. The measuring system of claim 1 further comprising a pulsating power source coupled to one of the plurality of in-situ interfaces.

10. The measuring system of claim 9 where the pulsating power source generates a normal pulse at about 100 kV.

11. The measuring system of claim 10 where the attenuation rations are substantially uniform.

12. The measuring system of claim 1 where the plurality of linear and dynamic elements are substantially equal.

13. The measuring system of claim 1 where the attenuation ratios are substantially uniform.

14. The measuring system of claim 1 where the attenuation ratios vary based on the position of the conductive shield to a source that couples one of the plurality of in-situ interfaces.

15. The measuring system of claim 1 where the attenuation ratios vary based on the input frequencies of the source that couples one of the plurality of in-situ interfaces.

16. The measuring system of claim 1 where the conductive shield further encloses a tunable elements and the shield is configured to vary with the topology of the circuit elements it protects.

17. A measuring system that minimizes the parasitic affects of lumped circuit elements comprising:
   a plurality of in-situ interfaces configured to conductively link a source to an internal load and an external load without open access to circuit elements, the in-situ interfaces coupled to a shunt conductor;
   a plurality of linear and dynamic elements conductively linked to the plurality of in-situ interfaces in series; the dynamic elements configured to overwhelm the parasitic self-capacitance of an input circuit coupled to at least one of the plurality of in-situ interfaces; and
   means enclosing at least one of the plurality of linear and dynamic elements comprising a conductive structure to electromagnetic interference and having a plurality of attenuation ratios configured to substantially dampen undesired reactance between the linear and dynamic elements that bridge at least two of the plurality of in-situ interfaces.

18. The measuring system of claim 17 where the plurality of linear and dynamic elements comprises resistive and reactive elements coupled in parallel.

19. The measuring system of claim 17 further comprising a semiconductor element having a capacitance that is automatically tuned to the plurality of linear and dynamic elements.

20. A measuring system that minimizes the parasitic affects of lumped circuit elements comprising:
   a plurality of in-situ interfaces configured to conductively link a source to an internal load and an external load without open access to circuit elements, the in-situ interfaces coupled to a shunt conductor;
   a plurality of linear and dynamic elements conductively linked to the plurality of in-situ interfaces in series; the dynamic elements configured to overwhelm the parasitic self-capacitance of an input circuit coupled to at least one of the plurality of in-situ interfaces; and
   a shield coupled to a ground and enclosing at least one of the plurality of linear and dynamic elements comprising a conductive surface to fields and electromagnetic interference and having substantially uniform attenuation ratios configured to substantially dampen the parasitic capacitance between of the linear and dynamic elements that bridge at least two of the plurality of in-situ interfaces.

21. The measuring system of claim 20 further comprising a medium energy beam transport power source coupled to one of the plurality of in-situ interfaces.

22. The measuring system of claim 21 where the medium energy beam transport power source generates a normal pulse at about 2.5 kV at about a 7% duty cycle.

* * * * *